United States Patent
Moldsvor

(10) Patent No.: US 8,749,419 B2
(45) Date of Patent: Jun. 10, 2014

(54) ADC WITH ENHANCED AND/OR ADJUSTABLE ACCURACY

(75) Inventor: Oystein Moldsvor, Tiller (NO)

(73) Assignee: Hittite Microwave Corporation, Chelmsford, MA (US)

( * ) Notice: Subject to any disclaimer, the term of this patent is extended or adjusted under 35 U.S.C. 154(b) by 0 days.

(21) Appl. No.: 13/389,663

(22) PCT Filed: Aug. 9, 2010

(86) PCT No.: PCT/IB2010/002283
§ 371 (c)(1),
(2), (4) Date: Apr. 30, 2012

(87) PCT Pub. No.: WO2011/018711
PCT Pub. Date: Feb. 17, 2011

(65) Prior Publication Data
US 2012/0206286 A1   Aug. 16, 2012

Related U.S. Application Data

(60) Provisional application No. 61/232,978, filed on Aug. 11, 2009.

(51) Int. Cl.
*H03M 1/12* (2006.01)
(52) U.S. Cl.
USPC .......................... 341/155; 341/118; 341/122
(58) Field of Classification Search
USPC .................................................. 341/122, 155
See application file for complete search history.

(56) References Cited

U.S. PATENT DOCUMENTS

| | | | | |
|---|---|---|---|---|
| 5,294,926 | A  | * | 3/1994 | Corcoran ...................... 341/120 |
| 6,259,281 | B1 | * | 7/2001 | Neff ................................ 327/91 |
| 6,771,203 | B1 | * | 8/2004 | Nairn ............................ 341/159 |
| 7,250,885 | B1 | * | 7/2007 | Nairn ............................ 341/141 |
| 7,330,140 | B2 | * | 2/2008 | Balakrishnan et al. ........ 341/118 |
| 7,352,309 | B2 | * | 4/2008 | Draxelmayr .................. 341/122 |
| 7,609,194 | B2 | * | 10/2009 | Makabe et al. ............... 341/155 |
| 7,649,485 | B1 | * | 1/2010 | Kaplan ......................... 341/155 |
| 7,961,123 | B2 | * | 6/2011 | Nagarajan et al. ............ 341/118 |
| 2003/0080885 | A1 | | 5/2003 | Tamba |
| 2004/0032358 | A1 | | 2/2004 | Asami |
| 2005/0270212 | A1 | | 12/2005 | Smith et al. |

FOREIGN PATENT DOCUMENTS

EP    1729420 A1    6/2006
GB    2457059 A    8/2009

OTHER PUBLICATIONS

Office Action issued by the European Patent Office on Dec. 17, 2012.
International Search Report and Written Opinion for PCT/IB2010/002283, dated Dec. 27, 2010.
Veeramachanen, et al., "Design of a low power, variable-resolution flash ADC," 2009 22ND International Conference on VLSI Design IEEE Piscataway, NJ, USA, Jan. 9, 2009, pp. 117-122, XP002613305, ISBN: 978-0-7695-3506-7.

* cited by examiner

*Primary Examiner* — Khai M Nguyen
(74) *Attorney, Agent, or Firm* — Rajesh Vallabh; Foley Hoag LLP

(57) ABSTRACT

An analog-to-digital-converter includes an input signal connector, an output signal port, two or more sub-ADCs, and a digital signal processing block. The result from each sub-ADC is used by the digital signal processing block to output data with increased performance.

10 Claims, 2 Drawing Sheets

ADC WITH ENHANCED AND/OR ADJUSTABLE ACCURACY

BACKGROUND

This application claims priority to U.S. Provisional Application Ser. No. 61/232,978 filed on Aug. 11, 2009.

TECHNICAL FIELD

This disclosure generally relates to analog-to-digital conversion and in particular to analog-to-digital converters (ADCS) with enhanced and/or adjustable accuracy.

BACKGROUND

Several electronic systems require analog-to-digital converters (ADCs) for their function. Depending on the characteristics of the system, there are specific requirements to the ADC and the performance parameters of the ADC. Increased performance as accuracy, resolution and linearity comes at a cost of increased power dissipation due to the laws of physics. The electronics industries therefore strive to obtain the best possible performance at the lowest possible power dissipation.

For many systems, the requirement to the ADC is very dependent on external conditions. For example, in a mobile communication system, the requirements vary according to distance to the base station and the presence of interfering signals. The system is therefore designed to work under worst scenarios resulting in higher requirements for the ADC and other circuitry. This results in an average power dissipation that is much higher than required since the requirements are set for worst case scenarios while the system very seldom operates under these conditions.

System designers therefore need ADCs where the accuracy and performance can be modified during operation. Previously, the solutions have been able to scale power dissipation with only a few percent by switching on and off auxiliary blocks and adjusting supply currents in the ADC. These solutions suffer from unpredictable performance in the low performance mode since each block work under unintended condition. The range of power dissipation variation is also very small.

SUMMARY OF THE DISCLOSURE

An analog-to-digital converter disclosed herein comprises several sub-ADCs, a signal input, a digital signal processing block and a digital output. Each sub-ADC converts the input signal with a given accuracy and transfers the output to the digital signal processing block. The average of the results from each sub-ADC is calculated to output a single digital output word with higher Signal-to-Noise Ratio.

BRIEF DESCRIPTION OF DRAWINGS

Features and advantages of the disclosed ADCs will be apparent to those of ordinary skill in the art in view of the detailed description of exemplary embodiments which is made with reference to the drawings.

DETAILED DESCRIPTION OF THE PRESENTLY PREFERRED EMBODIMENTS

The principle of operation of the disclosed ADCs is based on averaging of multiple ADC channels in order to increase accuracy.

Figure 1:
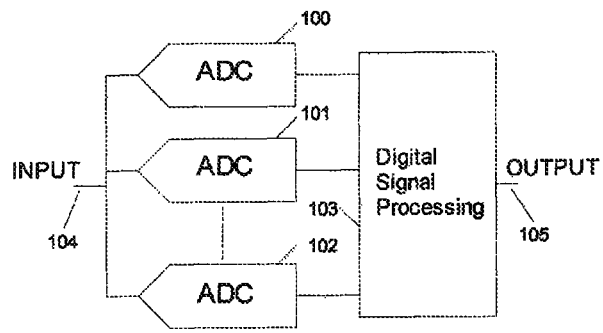
FIG. 1 shows a block diagram of the embodiment of a disclosed ADC with enhanced performance.
Figure 2:
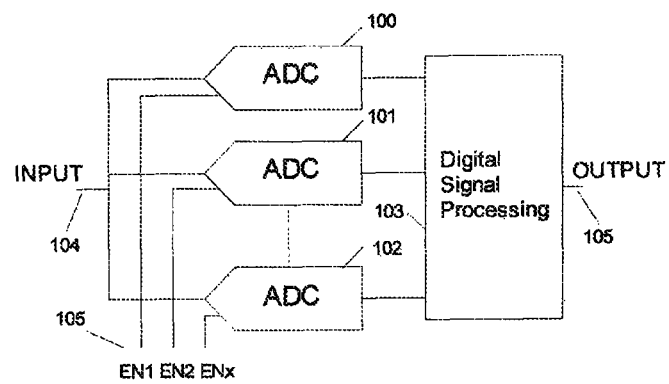
FIG. 2 shows a block diagram of the a disclosed ADC with enhanced and adjustable performance.

FIG. 1 shows an embodiment where accuracy is improved but fixed. FIG. 2 shows an embodiment where accuracy is improved and Adjustable. The basic operation of these two embodiments is the same, but flexibility is better for the embodiment in FIG. 2.

The operation of the circuit is as follows. The input signal 104 is applied to an arbitrary number of sub-ADCs 100-102 in parallel. These sub-ADCs can be completely separate ADCs or any combination of multi channel ADCs. This signal can be passed through separate buffers or analog signal conditioning circuitry without altering the principal operation of the disclosed ADCs. Each ADC samples the input signal and converts it to a digital word with a given accuracy. The digital output data are collected by a digital signal processing block and output in a suitable format for further processing.

The digital signal processing can be performed in different ways depending on desired properties of the output signal. However, the most obvious operation is to calculate the average of the data from each sub-ADC. Calculating the average is equivalent to summing all sub-ADC outputs and if desired truncate the output to a suitable number of bits.

Assuming that the noise is uncorrelated in each of the sub-ADCs, the equivalent output noise is reduced by a factor of 3 dB each time the number of sub-ADCs is doubled. Denoting the signal-to-noise-ratio (SNR) of a single sub-ADC as $SNR_{sub-ADC}$, the total SNR at the output ($SNR_{total}$) can be shown by Equation (1) below, if $N_{sub-ADC}$ equals the number of sub-ADCs are used.

$$SNR_{total} = SNR_{sub-ADC} + 10\log_{10}(N_{sub-ADC}) \quad (1)$$

This noise acts like ordinary thermal noise can be explained the following way: When adding two sub-ADC outputs, the output signal will double as the input signals are equal. The noise however is uncorrelated and must be added as root mean square (RMS) values resulting in a square root of two increase. Hence the SNR increases by the square root of two.

Adjustable performance can be obtained by the embodiment shown in FIG. 2. Specifically, in addition to the embodiments shown in FIG. 1, each sub-ADC in FIG. 2 comprises an enable input 105 allowing the user to enable or disable a given sub-ADC. In the disabled mode, the sub-ADC is in Power Down mode consuming an insignificant amount power. The digital signal processing block must be designed to properly scale the digital output depending on the number of active sub-ADCs.

With all channels enabled, the total ADC has full performance according to Equation (1). With only one channel enabled, the performance of the ADC is equal to the performance of the sub-ADC. Performance points between can be selected by having other numbers of sub-ADCs enabled.

As an example, with four sub-ADCs the total power dissipation can be adjusted with a factor of four, and total SNR can be adjusted in a 6 dB range A significant advantage with the disclosed ADCs over traditional approaches is that the performance in the low power modes is predictable. Each sub-ADC will work under optimum conditions, and performance is given by the characteristics of the sub-ADC. Compared to a solution where bias currents are manipulated to non-optimum values, the disclosed ADCs is superior.

Figure 3:
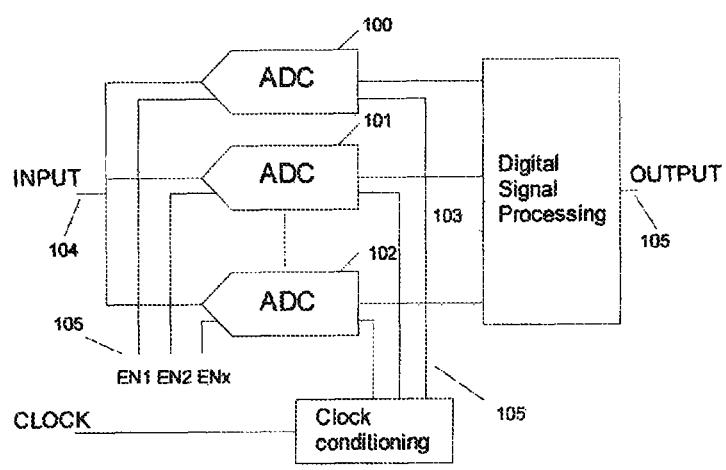
FIG. 3 shows a block diagram of an alternative embodiment ADC where the sampling clock to each channel is skewed in order to obtain possibilities for frequency domain filtering in addition to the improved performance.

Further improvements can be obtained by the embodiments in FIG. 3. The additional feature of the embodiment of FIG. 3 is the clock conditioning circuitry. This circuitry ensures that the sampling times of the sub-ADCs are distributed over the entire ADC clock cycle.

Figure 4:
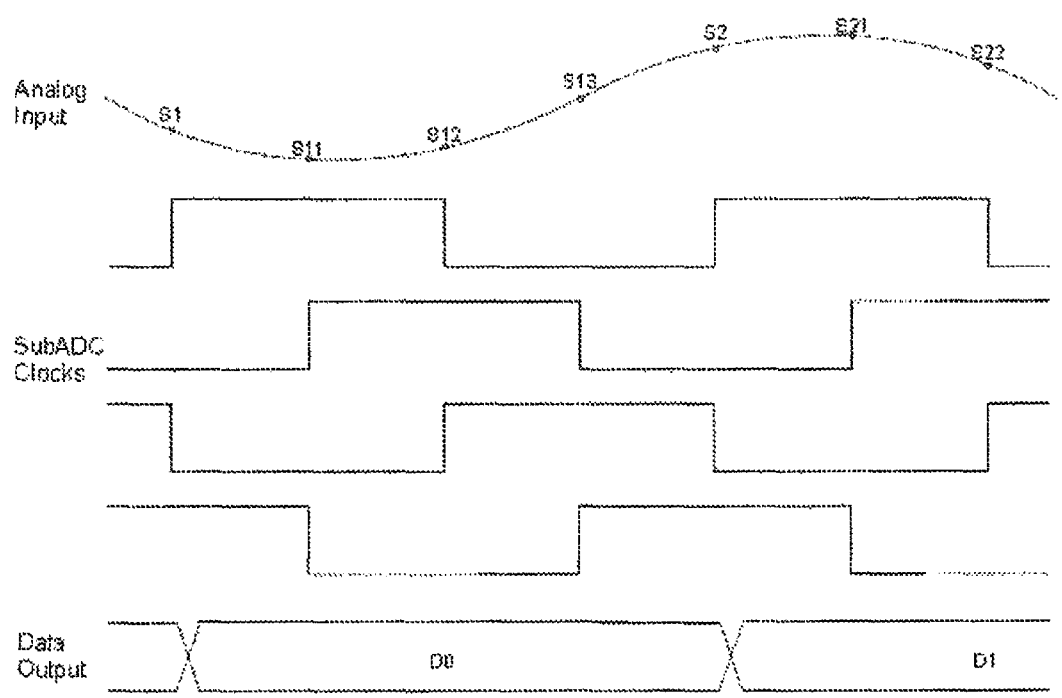

The timing diagram in FIG. 4 shows the timing in case of an ADC with four sub-ADCs. The main sampling points are S1 and S2 and consecutive points at the same frequency. Denote this frequency FS. Instead of having all sub-ADCs sampling at the same point, it is possible to make each sub-ADC sample at S11, S12 and S13 respectively, each one at frequency FS. Since the sub-ADC samples are distributed over the entire clock period, the effective sampling rate is increased by a factor of four. This moves the input frequency where signal components will be aliased into the signal band up with a factor of four to 4×FS/2 instead of FS/2. This will reduce the requirements to the Anti Aliasing filter required in front of any ADC. The Digital Signal processing block can filter out particular frequency bands outside the signal band, and a custom frequency mask can easily be made by modifying the digital signal processing block. Compared with the embodiment of FIG. 1 and FIG. 2 this gives an additional freedom to shape the signal in the frequency band, suppress particular aliased tones and simplify analog circuitry in front of the ADC.

If the signal band is set equal to FS/2, it is possible to get the same improvement in SNR as predicted by Equation 1. However, the digital signal processing block will be more complex than the averaging function required for the embodiments in FIGS. 1 and 2.

The detailed description is to be construed as exemplary only and does not describe every possible embodiment because describing every possible embodiment would be impractical, if not impossible. Numerous alternative embodiments could be implemented, using either current technology or technology developed after the filing date of this patent, which would still fall within the scope of this disclosure.

The invention claimed is:

1. An analog-to-digital-converter comprising:
   an input signal connector for receiving an input analog signal;
   an output signal port;
   two or more sub-ADCs, each sampling the analog input signal at the same point in time;
   and a digital signal processing block, whereas the result from each sub-ADC is combined by the digital signal processing block to output data at the output signal port with increased performance.

2. An analog-to-digital-converter according to claim 1 where the analog input signal is passed through separate blocks prior to being applied at the input of each sub-ADC.

3. An analog-to-digital-converter according to claim 1 further comprising:
   means to enable and disable the functionality of each sub-ADC individually;
   and wherein the digital signal processing block has the ability to select the number of sub-ADCs used to generate the output data thereby adjusting the total performance.

4. An analog-to-digital-converter according to claim 1, wherein the digital signal processing block calculates the average of the results from each sub-ADC.

5. An analog-to-digital-converter according to claim 4, wherein calculating the average comprises summing the results from each sub-ADC and truncating the sum to a given number of bits.

6. A method of operating an analog-to-digital-converter, comprising:
   receiving an input analog signal;
   sampling the analog input signal at the same point in time using two or more sub-ADCs; and
   combining the result from each sub-ADC to produce output data with increased performance.

7. The method of claim 6, further comprising passing the analog input signal through separate blocks prior to applying it at the input of each sub-ADC.

8. The method of claim 6, further comprising disabling the functionality of one or more selected sub-ADCs individually, thereby adjusting the totalperformance.

9. The method of claim 6, wherein combining the result comprises calculating the average of the results from each sub-ADC.

10. The method of claim 9, wherein calculating the average comprises summing the results from each sub-ADC and truncating the sum to a given number of bits.

* * * * *